(12) United States Patent
Bedell et al.

(10) Patent No.: US 10,672,929 B2
(45) Date of Patent: Jun. 2, 2020

(54) HETEROJUNCTION PHOTOVOLTAIC DEVICE AND FABRICATION METHOD

(71) Applicant: INTERNATIONAL BUSINESS MACHINES CORPORATION, Armonk, NY (US)

(72) Inventors: Stephen W. Bedell, Wappingers Falls, NY (US); Keith E. Fogel, Hopewell Junction, NY (US); Bahman Hekmatshoar-Tabari, White Plains, NY (US); Devendra K. Sadana, Pleasantville, NY (US); Ghavam G. Shahidi, Pound Ridge, NY (US); Davood Shahrjerdi, White Plains, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 54 days.

(21) Appl. No.: 15/334,807

(22) Filed: Oct. 26, 2016

(65) Prior Publication Data

US 2017/0047467 A1    Feb. 16, 2017

Related U.S. Application Data

(60) Division of application No. 14/717,284, filed on May 20, 2015, which is a continuation of application No.
(Continued)

(51) Int. Cl.
*H01L 31/0725*    (2012.01)
*H01L 31/078*    (2012.01)
(Continued)

(52) U.S. Cl.
CPC ...... *H01L 31/0725* (2013.01); *C23C 14/3407* (2013.01); *H01L 31/02167* (2013.01);
(Continued)

(58) Field of Classification Search
CPC ............. H01L 31/0745; H01L 31/1812; H01L 31/204; H01L 31/03765; H01L 31/1872;
(Continued)

(56) References Cited

U.S. PATENT DOCUMENTS 4,542,256 A * 9/1985 Wiedeman ............ H01L 31/065
136/249
5,180,435 A * 1/1993 Markunas ............... C23C 16/22
118/723 IR
(Continued)

FOREIGN PATENT DOCUMENTS

EP       1475844 A2   11/2004
WO   WO2009094578 A2   7/2009

OTHER PUBLICATIONS

"The General Properties of Si, Ge, SiGe, SiO2, and Si3N4" Virginia Semiconductor Materials Data Sheet, Jun. 2002.*
(Continued)

*Primary Examiner* — Andrew J Golden
(74) *Attorney, Agent, or Firm* — Tutunjian & Bitetto, P.C.; Erik Johnson

(57) ABSTRACT

A photovoltaic device and method include a doped germanium-containing substrate, an emitter contact coupled to the substrate on a first side and a back contact coupled to the substrate on a side opposite the first side. The emitter includes at least one doped layer of an opposite conductivity type as that of the substrate and the back contact includes at least one doped layer of the same conductivity type as that of the substrate. The at least one doped layer of the emitter contact or the at least one doped layer of the back contact is
(Continued)

in direct contact with the substrate, and the at least one doped layer of the emitter contact or the back contact includes an n-type material having an electron affinity smaller than that of the substrate, or a p-type material having a hole affinity larger than that of the substrate.

7 Claims, 5 Drawing Sheets

Related U.S. Application Data

13/194,301, filed on Jul. 29, 2011, now Pat. No. 9,099,596.

(51) Int. Cl.

| | | |
|---|---|---|
| *H01L 31/18* | (2006.01) | |
| *H01L 31/20* | (2006.01) | |
| *H01L 31/0747* | (2012.01) | |
| *C23C 14/34* | (2006.01) | |
| *H01L 31/0216* | (2014.01) | |
| *H01L 31/0224* | (2006.01) | |
| *H01L 31/074* | (2012.01) | |

(52) U.S. Cl.
CPC .... *H01L 31/022441* (2013.01); *H01L 31/074* (2013.01); *H01L 31/078* (2013.01); *H01L 31/0747* (2013.01); *H01L 31/1808* (2013.01); *H01L 31/1812* (2013.01); *H01L 31/204* (2013.01); *Y02E 10/50* (2013.01); *Y02P 70/521* (2015.11)

(58) Field of Classification Search
CPC ........... H01L 31/06875; H01L 31/0312; H01L 31/02167
USPC .................................................. 136/243–265
See application file for complete search history.

(56) References Cited

U.S. PATENT DOCUMENTS

| | | | |
|---|---|---|---|
| 2005/0000566 A1* | 1/2005 | Posthuma | H01L 31/02161 136/261 |
| 2006/0065297 A1 | 3/2006 | Terakawa | |
| 2007/0235074 A1* | 10/2007 | Henley | H01L 31/0232 136/252 |
| 2008/0230116 A1 | 9/2008 | Kannou et al. | |
| 2009/0215219 A1 | 8/2009 | Ajiki et al. | |
| 2009/0250108 A1* | 10/2009 | Zhou | H01L 31/02167 136/256 |
| 2010/0059119 A1* | 3/2010 | Yun | H01L 31/065 136/261 |
| 2010/0186802 A1 | 7/2010 | Borden | |
| 2011/0120538 A1 | 5/2011 | Lochtefeld et al. | |

OTHER PUBLICATIONS

Das, U., et al. "Surface Passivation and Heterojunction Cells on Si (100) and (111) Wafers Using DC and RF Plasma Deposited Si:H Thin Films" Applied Physics Letters, vol. 92. Nov. 2007. pp. 1-3.

Flamand, G., et al. "Towards Highly Efficient 4-Terminal Mechanical Photovoltaic Stacks" The Advanced Semiconductor Magazine, vol. 19, No. 7. Sep. 2006. pp. 24-27.

Heide, J., et al. "Development of Low-Cost Thermophotovoltaic Cells Using Germanium Substrates" Seventh World Conference on Thermophotovoltaic Generation of Electricity. AIP Conference Proceedings, vol. 890. 2007. pp. 129-138.

Jensen, N., et al. "Optimization and Characterization of Amorphous/Crystalline Silicon Heterojunction Solar Cells" Progress in Photovoltaics: Research and Applications, vol. 10. Nov. 2001. pp. 1-13.

Kanevce, A., et al. "The Role of Amorphous Silicon and Tunneling in Heterojunction With Intrinsic Thin Layer (HIT) Solar Cells" Journal of Applied Physics, 105. Dec. 2008. pp. 1-7.

Karam, N., et al. "Recent Developments in High-Efficiency Ga0.5In0.5P/GaAs/Ge Dual- and Triple-Junction Solar Cells: Steps to Next-Generation PV Cells" Solar energy Materials & Solar Cells, 66. 2001. pp. 453-466.

Kinoshita, T., et al. "High-Efficiency HIT Solar Cells for Excellent Power Generating Properties" Materials Research Society Symposium Proceedings, vol. 1123. 2009. (8 Pages).

Krut, D., et al. "The Development of Ge Bottom Cell for Monolithic and Stacked Multi-Junction Applications" Conference Record of the Twenty Second IEEE Photovoltaic Specialists Conference, vol. 1. Oct. 1991. pp. 90-92.

Posthuma, N., et al. "Development of Stand-Alone Germanium Solar Cells for Application in Space Using Spin-On Diffusants" 3rd World Conference on Photovoltaic Energy Conversion. May 2003. pp. 777-780.

Posthuma, N., et al. "Emitter Formation and Contact Realization by Diffusion for Germanium Photovoltaic Devices" IEEE Transactions on Electron Devices, vol. 54, No. 5. May 2007. pp. 1210-1215.

Schmidt, M., et al. "Physical Aspects of a-Si:H/c-Si Hetero-Junction Solar Cells" Thin Solid Films, 515. Jan. 2007. pp. 7475-7480.

Timo, G., et al. "Bottom Cell Growth Aspects for Triple Junction InGaP/(In)GaAs/Ge Solar Cells" Cryst. Res. Technol. 40, No. 10-11. Dec. 2004. pp. 1043-1047.

Wang, Q., et al. "Efficient Heterojunction Solar Cells on P-Type Crystal Silicon Wafers" Applied Physics Letters, 96. Oct. 2009. pp. 1-3.

U.S. Office Action dated Jul. 2, 2015 for U.S. Appl. No. 13/607,004.
Office Action dated Jan. 19, 2017 in counterpart U.S. Appl. No. 13/607,004, filed Sep. 7, 2012 (pp. 1-19).

* cited by examiner

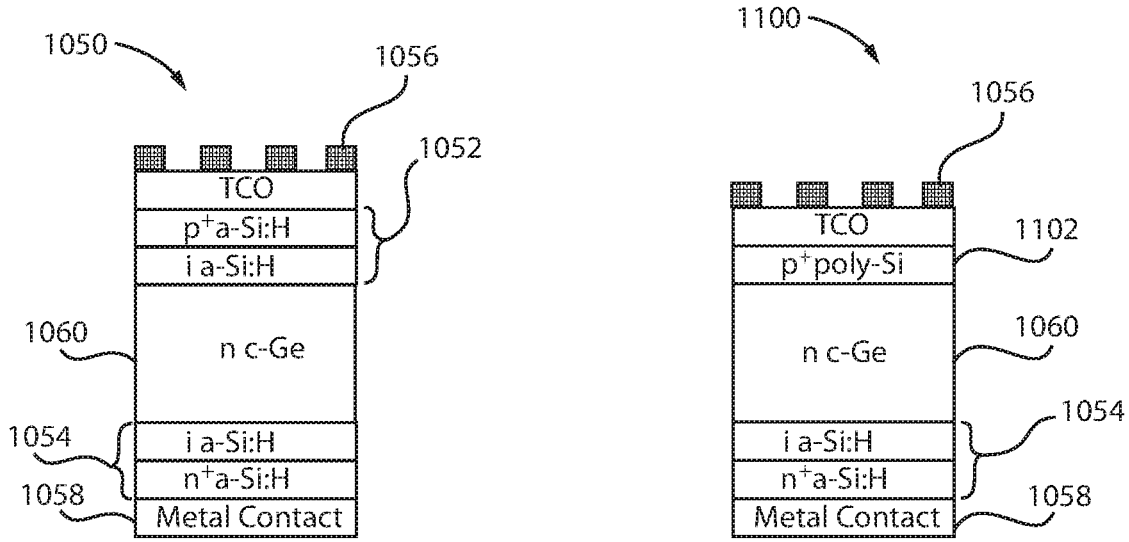
FIG. 12A
FIG. 12B
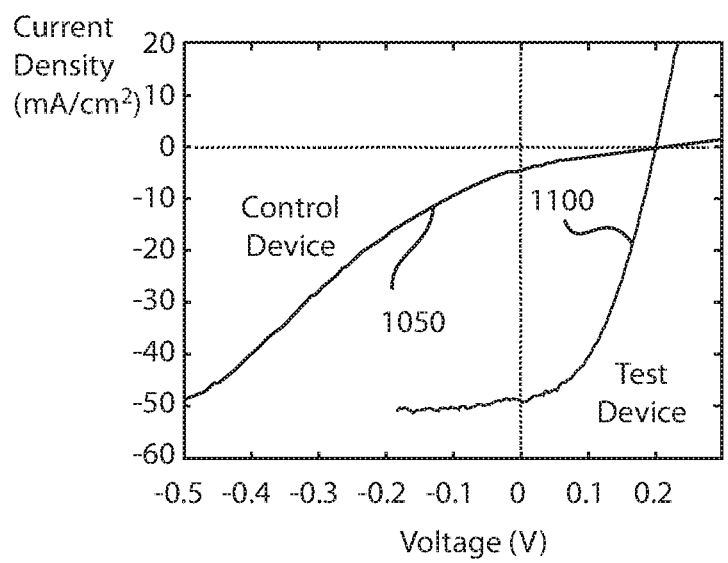
FIG. 13

HETEROJUNCTION PHOTOVOLTAIC DEVICE AND FABRICATION METHOD

BACKGROUND

Technical Field

The present invention relates to photovoltaic devices, and more particularly to heterojunction photovoltaic devices fabricated using a low temperature process.

Description of the Related Art

Ge solar cells are used as the bottom cells in high-efficiency multi-junction solar cells. Since Ge is an expensive material, it is desired to fabricate solar cells on thin layers of Ge transferred from a boule or wafer, onto a handle substrate. The electrical junctions in conventional crystalline Ge solar cells are formed by high temperature processes such as diffusion, which are not compatible with typical low-cost handle substrates such as plastic. Therefore, low temperature processes are highly desired for post-processing of thin Ge wafers transferred onto low-cost handle substrates. In addition, lowering the process temperature may reduce the fabrication cost of the solar cell regardless of the usage of a handle substrate, as well as allowing the usage of low cost Ge wafers which may be degraded at high process temperatures.

Referring to FIG. 1, the structure of the most high-efficiency stand-alone solar cells includes an n+ emitter c-Ge contact 10 formed by phosphorous diffusion from a spin-on-dopant at ~600° C. and a p+c-Ge back-surface-field contact 12 is formed by screen printing or deposition of Al, followed by annealing at temperatures above the Ge—Al alloy eutectic temperature (~425° C.). The emitter contact 10, a substrate layer 14 and the back-surface-field contact 12 all include crystalline Ge (c-Ge). An emitter passivation layer 16 may be provided by a plasma enhanced chemical vapor deposition (PECVD) of hydrogenated amorphous Si (a-Si:H). The passivation layer 16 improves the solar cell efficiency by reducing the recombination of electron-hole pairs at the surface of the emitter layer ($n^+$ c-Ge). However, the passivation layer 16 is not fundamental to the device operation and may be omitted. The front (emitter) contact 10 includes the passivation layer 16 with metal fingers 20 formed through the layer 16 by lithography or by diffusion of metal through this passivation layer 16 at about 200° C. The back contact 12 includes an Al layer 18. The best open-circuit voltage achieved for these cells is ~270 mV. The low open circuit voltage is due to (i) the low bandgap of Ge, and (ii) the lack of sufficient surface passivation at the front and back of the cell.

SUMMARY

A photovoltaic device includes a doped germanium-containing substrate, an emitter contact coupled to the substrate on a first side and a back contact coupled to the substrate on a side opposite the first side. The emitter includes at least one doped layer of an opposite conductivity type as that of the substrate and the back contact includes at least one doped layer of the same conductivity type as that of the substrate. The at least one doped layer of the emitter contact or the at least one doped layer of the back contact is in direct contact with the substrate, and the at least one doped layer of the emitter contact or the back contact includes an n-type material having an electron affinity smaller than that of the substrate, or a p-type material having a hole affinity larger than that of the substrate.

A multi-junction photovoltaic device includes a top cell including a photovoltaic cell configured to initially receive light and a bottom cell. The bottom cell includes a germanium-containing substrate coupled to an emitter contact on a front side of the substrate and a back contact on a back side of the substrate. At least one doped layer in the emitter contact or the back contact comprised of an n-type material has an electron affinity smaller than that of the germanium-containing substrate, or a p-type material having a hole affinity larger than that of the germanium containing substrate. A passivation layer is in contact with the at least one doped layer and disposed between the substrate and the one of the emitter contact and the back contact.

A multi-junction photovoltaic device includes a top cell including a photovoltaic cell configured to initially receive light and a bottom cell. The bottom cell includes a doped germanium-containing substrate, an emitter contact coupled to the substrate on a first side and a back contact coupled to the substrate on a side opposite the first side. The emitter includes at least one doped layer of an opposite conductivity type as that of the substrate, and the back contact includes at least one doped layer of the same conductivity type as that of the substrate. The at least one doped layer of the emitter contact or the at least one doped layer of the back contact is in direct contact with the substrate, and the at least one doped layer of the emitter contact or the back contact includes an n-type material having an electron affinity smaller than that of the substrate, or a p-type material having a hole affinity larger than that of the substrate.

A method for fabricating a photovoltaic device includes forming an emitter contact on a front side of a germanium-containing substrate and a back contact on a back side of the germanium substrate wherein the step of forming includes: configuring at least one of the emitter contact and the back contact to include a doped layer in direct contact with the germanium-containing substrate, the doped layer including one of an n-type semiconductor material having an electron affinity smaller than that of the germanium-containing substrate, or a p-type semiconductor material having a hole affinity larger than that of the germanium containing substrate; and forming a passivation layer in contact with the doped layer.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein:

FIG. 12A is a cross-sectional view of a control device fabricated for comparison with a test device in FIG. 12B;

FIG. 12B is a cross-sectional view of a test device in accordance with the present principles; and FIG. 13 is a plot of the test device (FIG. 12B) versus the control device (FIG. 12A) showing improved performance in accordance with the present principles.

DETAILED DESCRIPTION OF PREFERRED EMBODIMENTS

Figure 1:
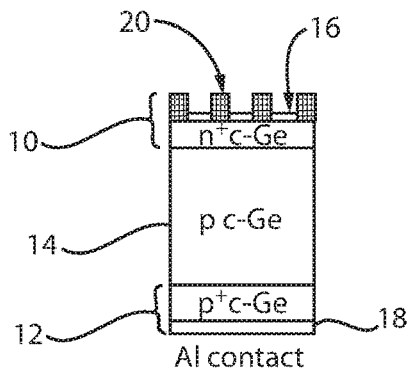
FIG. 1 is a cross-sectional view of a conventional c-Ge stand-alone solar cell.

In accordance with the present principles, device structures and fabrication methods are provided for improving open circuit voltage of a photovoltaic cell by using wider-bandgap contacts with proper bandgap engineering to avoid compromising fill-factor of the cell. In addition, a fabrication method is provided to reduce process temperatures to as low as ~200° C. The low process temperature (i) reduces the thermal budget and therefore potentially lowers process cost, (ii) preserves the bulk-lifetime of the absorption layer of the device, and (iii) is suitable for low-temperature low-cost flexible substrates (this is particularly useful if the substrate includes a thin layer of crystalline germanium (c-Ge) or other crystalline form transferred onto a handle substrate, such as plastic.

It is to be understood that the present invention will be described in terms of a given illustrative architecture having substrates and photovoltaic stacks; however, other architectures, structures, substrates, materials and process features and steps may be varied within the scope of the present invention.

It will also be understood that when an element such as a layer, region or substrate is referred to as being "on" or "over" another element, it can be directly on the other element or intervening elements may be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for a photovoltaic device may be created for integrated circuit integration or may be combined with components on a printed circuit board. The circuit/board may be embodied in a graphical computer programming language, and stored in a computer storage medium (such as a disk, tape, physical hard drive, or virtual hard drive such as in a storage access network). If the designer does not fabricate chips or the photolithographic masks used to fabricate chips or photovoltaic devices, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of photovoltaic devices and/or integrated circuit chips with photovoltaic devices. The resulting devices/chips can be distributed by the fabricator in raw wafer form (that is, as a single wafer that has multiple unpackaged devices/chips), as a bare die, or in a packaged form. In the latter case the device/chip is mounted in a single chip package (such as a plastic carrier, with leads that are affixed to a motherboard or other higher level carrier) or in a multichip package (such as a ceramic carrier that has either or both surface interconnections or buried interconnections). In any case the devices/chips is then integrated with other chips, discrete circuit elements, and/or other signal processing devices as part of either (a) an intermediate product, such as a motherboard, or (b) an end product. The end product can be any product that includes integrated circuit chips, ranging from toys, energy collectors, solar devices and other applications including computer products or devices having a display, a keyboard or other input device, and a central processor.

It should be noted that the drawings with include listings of compounds and forms or the compounds which are for illustrative purposes and ease of understanding and should not be construed as limiting. For example, a substrate may include the layer c-Ge; however, other forms of germanium (polycrystalline, nano/microcrystalline and single crystalline) may also be employed. Notations such as SiGe or SiC include any ratio of these compounds such as $Si_{1-x}Ge_x$ or $Si_{1-y}C_y$. These compounds may take different forms as well, e.g., polycrystalline, nano/microcrystalline, single crystalline or even amorphous.

Figure 2A:
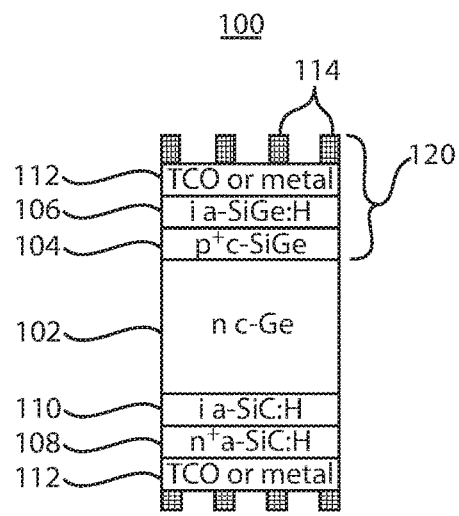
FIG. 2A is a cross-sectional view of a Ge cell with an n-type substrate in accordance with the present principles.
Figure 2B:
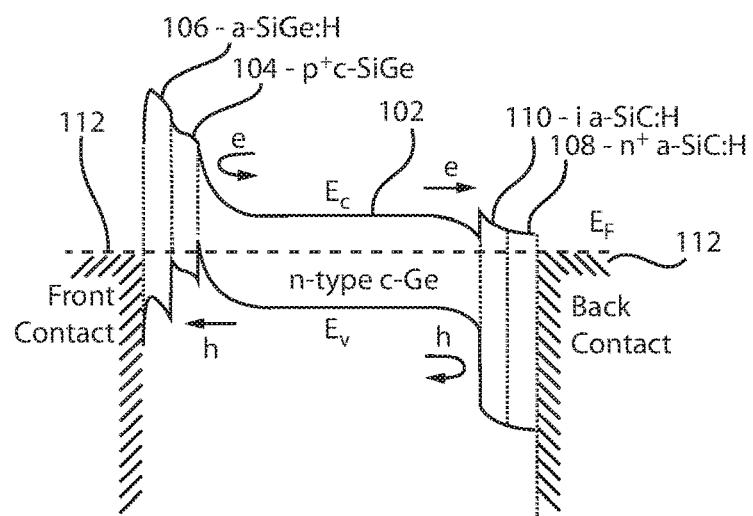
FIG. 2B is an energy band diagram of the cell of FIG. 2A.

Referring now to the drawings in which like numerals represent the same or similar elements and initially to FIGS. 2A and 2B, a structure of a photovoltaic device 100 (FIG. 2A) and its corresponding energy band diagram (FIG. 2B) are illustratively shown. The cell 100 includes a substrate 102. The substrate 102 may include a germanium-containing substrate 102, such as an n-type crystalline germanium (c-Ge). Examples of the germanium containing substrates may include but are not limited to crystalline, poly-crystalline or multi-crystalline germanium, and crystalline, poly-crystalline or multi-crystalline silicon-germanium. A $p^+$ type layer 104 which may include $Si_{1-x}Ge_{x1}$ and may be single-crystalline or poly/micro-crystalline, is grown using one of the following methods: (i) plasma enhanced chemical vapor deposition (PECVD) or hot-wire chemical vapor deposition (HWCVD) growth from a mixture of silane, germane (for x1>0), hydrogen and diborane at conditions leading to single-crystalline growth at deposition temperatures as low as 200° C.; (ii) PECVD or HWCVD of p+ amorphous hydrogenated silicon germanium (a-Si$_{x1}$Ge$_{1-x1}$:H) from the same gas mixture at known conditions leading to amorphous film growth at ~200° C. or below, or sputtering/co-sputtering or thermal/e-beam evaporation/co-evaporation to form known solid sources, followed by solid-phase crystallization of the layer using high-temperature annealing (e.g., up to ~600° C.); or (iii) chemical vapor deposition (CVD) or molecular beam epitaxy (MBE) growth. Examples of CVD include but are not limited to rapid thermal CVD (RTCVD), low-pressure CVD (LPCVD) and ultra-high-vacuum CVD (UHVCVD). The value of x1 may be constant or vary across the SiGe layer 104. The p+ layer 104 may be passivated by a PECVD or HWCVD growth of intrinsic layer 106 which may include a-Si$_{1-x2}$Ge$_{x2}$:H from silane, germane and hydrogen at ~200° C. The value of x2 may be constant or vary across the SiGe layer 106. There is no correlation between x1 and x2.

An intrinsic layer 110 and an n+ layer 108 are preferably grown by PECVD or HWCVD from silane, hydrogen, methane and/or ethylene/acetylene (for y1, y2>0), and phosphorous (for the n+ layer 108) at 200° C. The n+ layer 108 may include amorphous hydrogenated silicon carbide (a-Si$_{1-y1}$C$_{y1}$:H). Intrinsic layer 110 may include (a-Si$_{1-y2}$C$_{y2}$:H). The SiGe layers 104 and 106 may include carbon amorphous hydrogenated silicon carbide (e.g., by flowing methane and/or ethylene/acetylene during formation) and the SiC layers 108 and 110 may include Ge (e.g., by flowing germane during formation). The SiGe and SiC layers 104, 106, 108 and 110 may include fluorine, nitrogen, oxygen and/or deuterium. The values of y1 and y2 may be constant or vary across the SiC layers 108, 110. There is no correlation between y1 and y2, or between x1/x2 and y1/y2.

A thickness for the intrinsic layers (i-layers) 106 and 110 may be approximately about 5 nm but thicknesses in the range of 0-25 nm are also contemplated. The thickness for the n+ layer 108 is in the range of 0-50 nm. The thickness also depends on the type of contact, e.g., a range for the emitter contact is preferably between about 3 nm to about 8 nm but the thickness for the back contact is preferably between 5 nm and 20 nm.

Doping of the p+ layer 104 may be about ~$10^{19}$ cm$^{-3}$ with a thickness of about 10 nm. Doping in the range of $10^{18}$-$10^{20}$ cm$^{-3}$ and thicknesses in the range of 1 nm-150 nm are contemplated for layer 104. A thicker p+ layer 104 is needed for a lower doping concentration.

The structure of device 100 further includes electrodes 112. Electrodes 112 include a conductor which may be a transparent conductive material such as a transparent conductive oxide (TCO), such as, e.g., Al-doped zinc oxide, indium tin oxide, etc. or a metal (such as, e.g., tungsten, silver, aluminum, etc.). If layer 112 is composed of a transparent conductive material, metal fingers 114 are needed to allow for low electrical contact resistance, while if layer 112 is composed of a metal, the electrical conductivity of the contact is sufficient and the metal fingers 114 are not needed. At least one of the layers 112 is composed of a transparent conductive material to permit light to enter and be absorbed. If both layers 112 are composed of transparent conductive materials, the light can enter from both sides of the cell 100 (a bifacial cell).

FIG. 2B shows the equilibrium Fermi level denoted by E$_F$, and the conduction band and valance band edges denoted by E$_c$ and E$_v$, respectively. Open circuit voltage of the cell 100 (V$_{oc}$), times the charge of an electron (q), i.e., q×V$_{oc}$ is equal to the separation of the quasi Fermi level for electrons "e" at an emitter (front) side and the quasi Fermi level for holes "h" at a back contact under illumination (not shown). A conventional Ge cell employs crystalline Ge back and front contacts. Replacing the conventional crystalline Ge contacts with materials such as a-Si:H and a-SiC:H significantly reduces the process temperature, but it is restrictive to the flow of holes in particular. This is because the valence band offset between crystalline Ge and these materials is large (~0.7 eV or larger).

In accordance with the present principles, the emitter contact 120 and/or the back contact 122 are configured to reduce the valence band offset described above by including a doped layer (e.g., 104, 108) having a composition of elements adjusted to provide a bandgap that improves open circuit voltage while at least maintaining fill factor (i.e. not restricting carrier flow, in particular holes). In a particularly useful embodiment, the doped layer may include Si$_x$Ge$_{1-x}$ or Si$_x$C$_{1-x}$. The value of x is adjusted during formation or after formation of the doped layer to adjust the band gap of the doped layers to enable a reduced band offset especially at the valence band. The value of x may be constant or vary across the SiGe layer.

The emitter contact 120 and/or the back contact 122 includes at least one doped layer comprised of an n-type material having an electron affinity smaller than that of the germanium-containing substrate 102, or a p-type material having a hole affinity larger than that of the germanium containing substrate 120. A passivation layer (106, 110) is formed in contact with the doped layer and is disposed between the substrate and the one of the emitter contact 120 and the back contact 122. The passivation layers 106 and 110 are intrinsic but may be intentionally or unintentionally doped. Intentional doping may be incorporated, for example, by flowing a dopant gas during deposition. Unintentional doping may be incorporated, for example, by the presence of the dopant atom residues in the deposition chamber (for example, if the same chamber is used for depositing both intrinsic and doped layers). The passivation layers 106 and 110 improve the solar cell efficiency by reducing the recombination of electron-hole pairs (at the top surface of layer 104 and bottom surface of substrate 102, respectively). However, the passivation layers are not fundamental to the device operation and may be omitted without losing the device functionality.

The structure improves the open circuit voltage of the cell 100 by using wider-bandgap contacts (e.g., layers 104/106 and/or layers 108/110) with proper bandgap engineering to avoid compromising the fill-factor of the cell. The bandgap of contact materials, i.e., layers 104/106 and 108/110 is in the range of 0.6 eV-4.0 eV, with the range of 0.7-1.8 eV being more preferred. The n-type contact material(s) (i.e., layers 108/110) is chosen to have a lower electron affinity than that of the germanium-containing substrate material 102. The difference between the electron affinities of two materials is referred to as the conduction band-offset between the two materials. Increasing the conduction band offset between layers 108/110 and the absorption layer 102 increases the open circuit voltage of the cell, but an excessively large conduction band offset reduces the fill-factor of the cell by blocking the electron flow. The conduction band-offset between layers 108/110 and the absorption layer 102 may be in the range of 0.0-1.0 eV, with the range of 0.05-0.5 eV being more typical. The sum of electron affinity ($\chi_e$) and bandgap energy ($E_g$), i.e., $\chi_e+E_g$ of a material is referred to as the hole affinity ($\chi_h$) of the material. The p-type contact material(s) (i.e., layers 104/106) is chosen to have a higher hole affinity than that of the germanium-containing substrate material 102. The difference between the hole affinities of two materials is referred to as the valence band-offset between the two materials. Increasing the valence band offset between layers 104/106 and the absorption layer 102 increases the open circuit voltage of the cell, but an excessively large valence band offset reduces the fill-factor of the cell by blocking the hole flow. The valence band-offset between layers 104/106 and the absorption layer 102 may be in the range of 0-1.0 eV, with the range of 0.05-0.5 eV being more typical.

Figure 3A:
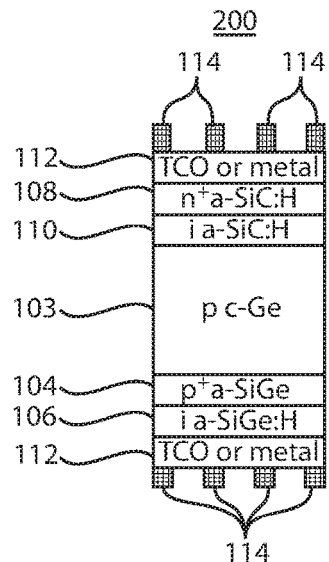
FIG. 3A is a cross-sectional view of a Ge cell with a p-type substrate in accordance with the present principles.
Figure 3B:
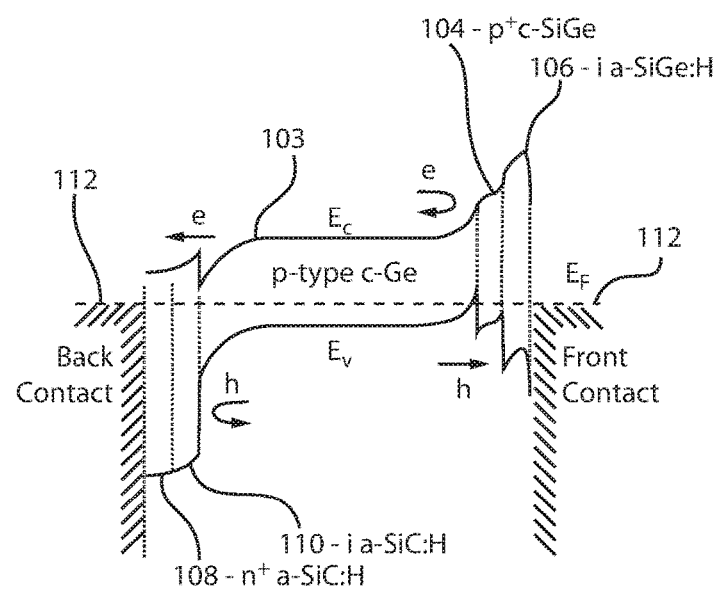
FIG. 3B is an energy band diagram of the cell of FIG. 3A.

Referring to FIGS. 3A and 3B, a structure of a photovoltaic device 200 (FIG. 3A) and its corresponding energy band diagram (FIG. 3B) are illustratively shown. The cell 200 includes a substrate 103. The substrate 103 may include a p-type germanium containing material, e.g., crystalline Ge (c-Ge). The structure with a p-type substrate 103 has its contacts reversed with respect to the cell 100. As described above, the p$^+$ type layer 104 which may include $Si_{1-x1}Ge_{x1}$ and may be single-crystalline or poly/micro-crystalline, is grown using one of the following methods: (i) plasma enhanced chemical vapor deposition (PECVD) or hot-wire chemical vapor deposition (HWCVD) growth from a mixture of silane, germane (for x1>0), hydrogen and diborane at conditions leading to single-crystalline growth at deposition temperatures as low as 200° C.; (ii) PECVD or HWCVD of p$^+$ amorphous hydrogenated silicon germanium (a-$Si_{x1}$$Ge_{1-x1}$:H) from the same gas mixture at known conditions leading to amorphous film growth at ~200° C. or below, or sputtering/co-sputtering or thermal/e-beam evaporation/co-evaporation from known solid sources, followed by solid-phase crystallization of the layer using high-temperature annealing (e.g., up to ~600° C.); or (iii) chemical vapor deposition (CVD) or molecular beam epitaxy (MBE) growth. Examples of CVD include but are not limited to rapid thermal CVD (RTCVD), low-pressure CVD (LPCVD) and ultra-high-vacuum CVD (UHVCVD). The p$^+$ layer 104 is passivated by a PECVD or HWCVD of intrinsic layer 106 which may include a-$Si_{1-x2}Ge_{x2}$:H from silane, germane and hydrogen at ~200° C. The values of x1 and x2 may be constant or vary across the SiGe layers (104, 106). There is no correlation between x1 and x2.

The intrinsic layer 110 and the n$^+$ layer 108 are preferably grown by PECVD or HWCVD from silane, hydrogen, methane and/or ethylene/acetylene (for x1, x2>0), and phosphorous (for the n$^+$ layer 108) at ~200° C. The n+ layer 108 may include amorphous hydrogenated silicon carbide (a-$Si_{1-y1}C_{y1}$:H). Intrinsic layer 110 may include (a-$Si_{1-y2}C_{y2}$:H). The SiGe layers 104 and 106 may include carbon (e.g., by flowing methane and/or ethylene/acetylene during formation) and the SiC layers 108 and 110 may include Ge (e.g., by flowing germane during formation). The SiGe and SiC layers 104, 106, 108 and 110 main include fluorine, nitrogen, oxygen and/or deuterium. The values of y1 and y2 may be constant or vary across the SiC layers. There is no correlation between y1 and y2, or between x1/x2 and y1/y2.

As before, thickness for the intrinsic layers (i-layers) 106 and 110 may be approximately about 5 nm but thicknesses in the range of 0-25 nm are also contemplated. The thickness for the n$^+$ layer 108 is in the range of 0-50 nm. The thickness also depends on the type of contact, e.g., a range for the emitter contact is preferably between about 3 nm to about 8 nm but the thickness for the back contact is preferably between 5 nm and 20 nm.

Doping of the p$^+$ layer 104 may be about ~$10^{19}$ cm$^{-3}$ with a thickness of about 10 nm. Doping in the range of $10^{18}$-$10^{20}$ cm$^{-3}$ and thicknesses in the range of 1 nm-150 nm are contemplated for layer 104. A thicker p$^+$ layer 104 is needed for a lower doping concentration.

The cell 200 further includes electrodes 112. Electrodes 112 include a conductor which may be a transparent conductive material such as a transparent conductive oxide (TCO), such as, e.g., Al-doped zinc oxide, indium tin oxide, etc. or a metal (such as, e.g., tungsten, silver, aluminum, etc.). If layer 112 is composed of a transparent conductive material, metal fingers 114 are needed to allow for low electrical contact resistance, while if layer 112 is composed of a metal, the electrical conductivity of the contact is sufficient and the metal fingers 114 are not needed. At least one of the layers 112 is composed of a transparent conductive material to permit light to enter and be absorbed. If both layers 112 are composed of transparent conductive materials, the light can enter from both sides of the cell 200 (a bifacial cell).

FIG. 3B shows the equilibrium Fermi level ($E_F$) and the conduction band and valance band edges ($E_c$ and $E_v$, respectively). Open circuit voltage of the cell 200 (Voc), times the charge of an electron (q), i.e., q×$V_{oc}$ is equal to the separation of the quasi Fermi level for electrons "e" at an emitter (front) side and the quasi Fermi level for holes "h" at a back contact under illumination (not shown).

The structure improves the open circuit voltage of the cell 200 by using wider-bandgap contacts (e.g., layers 104/106 and/or layers 108/110) with proper bandgap engineering to avoid compromising the fill-factor of the cell. The bandgap of contact materials, i.e. layers 104/106 and 108/110 is in the range of 0.6-4.0 eV, with the range of 0.7-1.8 eV being more preferably. The n-type contact material(s) (i.e., layers 108/110) is chosen to have a lower electron affinity than that of the germanium-containing substrate material 103. Increasing the conduction band offset between layers 108/110 and the absorption layer 103 increases the open circuit voltage of the cell, but an excessively large conduction band offset reduces the fill-factor of the cell by blocking the electron flow. The conduction band-offset between layers 108/110 and the absorption layer 103 may be in the range of 0.0-1.0 eV, with the range of 0.05-0.5 eV being more typical. The p-type contact material(s) (i.e. layers 104/106) is chosen to have a higher hole affinity than that of the germanium-containing substrate material 103. Increasing the valence band offset between layers 104/106 and the absorption layer 103 increases the open circuit voltage of the cell but an excessively large valence band offset reduces the fill-factor of the cell by blocking the hole flow. The valence band-offset between layers 104/106 and the absorption layer 103 may be in the range of 0.0-1.0 eV, with the range of 0.05-0.5 eV being more typical.

Figure 4:
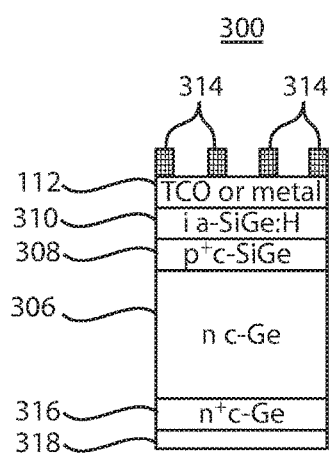
FIG. 4 is cross-sectional view of a hybrid Ge cell with an n-type substrate having one contact in accordance with the present principles and the other contact being a conventional contact.
Figure 5:
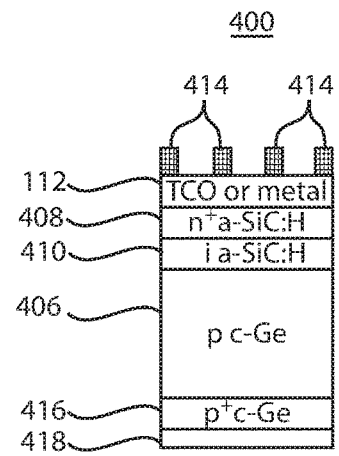
FIG. 5 is cross-sectional view of a hybrid Ge cell with a p-type substrate having one contact in accordance with the present principles and the other contact being a conventional contact.

Referring to FIGS. 4 and 5, examples of hybrid cells 300 and 400 are respectively shown in accordance with other illustrative embodiments. The hybrid structures 300 and 400 include a contact in accordance with the present principles and a contact on one side of the cell which has a conventional structure.

In the example shown in FIG. 4, the cell 300 includes an n-type c-Ge substrate 306 and a top contact 304, which includes a p+ doped layer 308 including, e.g., c-$Si_{1-x1}Ge_{x1}$:H and an intrinsic layer 310 including, e.g., a-$Si_{1-x2}Ge_{x2}$:H. A bottom contact 302 may include any known contact structure and includes an n+c-Ge layer 316 and a metal contact 318 (e.g., Aluminum) in this example. Other structures or layers may include an electrode 112, metal fingers 314, etc. The values of x1 and x2 may be constant or vary across the SiGe layers. There is no correlation between x1 and x2.

In the example shown in FIG. 5, the cell 400 includes a p-type c-Ge substrate 406 and a top contact 404, which includes an n+ doped layer 408 including, e.g., a-$Si_{1-y1}C_{y1}$:H and an intrinsic layer 410 including, e.g., a-$Si_{1-y2}C_{y2}$:H. A bottom contact 402 may include any known contact structure and includes a p+c-Ge layer 416 and a metal contact 418 (e.g., Aluminum) in this example. Other structures or layers may include an electrode 112, metal fingers 414, etc. The values of y1 and y2 may be constant or vary across the SiC layer. There is no correlation between y1 and y2.

Figure 6:
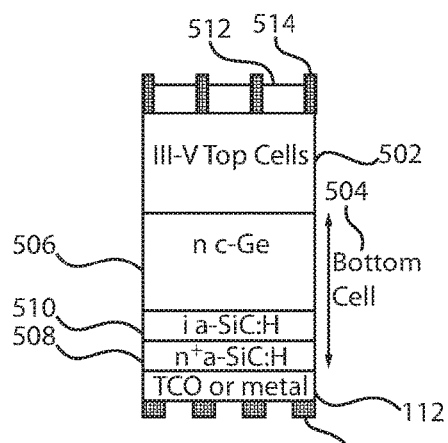
FIG. 6 is a cross-sectional view of a multi-junction device having a Ge bottom cell with an n-type substrate in accordance with the present principles and a top cell including III-V materials in accordance with one embodiment.

Referring to FIG. 6, a multi-junction embodiment includes a bottom cell 504 formed in accordance with the present principles and a top cell 502 having one or more conventional cells. The bottom cell 504 employs an n-type c-Ge substrate 506, an n+ doped layer 508 including, e.g., a-$Si_{1-y1}C_{y1}$:H and an intrinsic layer 510 including, e.g., a-$Si_{1-y2}C_{y2}$:H. The values of y1 and y2 may be constant or vary across the SiC layer. There is no correlation between y1 and y2. The top cell 502 may include any known contact structure and may include III-V materials or the like. Other structures or layers may include an anti-reflection coating (ARC) 512, electrodes 112, metal fingers 514, etc.

Figure 7:
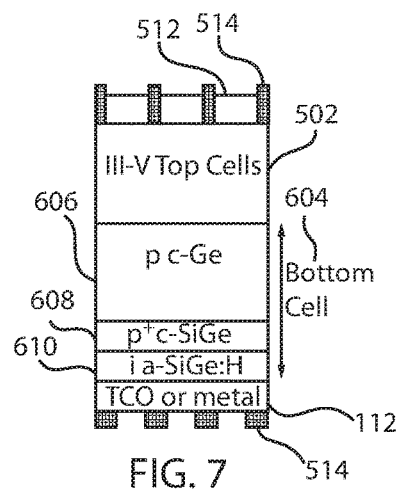
FIG. 7 is a cross-sectional view of a multi-junction device having a Ge bottom cell with a p-type substrate in accordance with the present principles and a top cell including III-V materials in accordance with one embodiment.

Referring to FIG. 7, another multi-junction embodiment includes a bottom cell 604 formed in accordance with the present principles and a top cell 502 having one or more conventional cells. The bottom cell 604 employs a p-type c-Ge substrate 606, a p+ doped layer 608 including, e.g., a-$Si_{1-x1}Ge_{x1}$:H and an intrinsic layer 610 including, e.g., a-$Si_{1-x2}Ge_{x2}$:H. The values of x1 and x2 may be constant or vary across the SiGe layers. There is no correlation between x1 and x2. The top cell 502 may include any known contact structure and may include III-V materials or the like. Other structures or layers may include an anti-reflection coating (ARC) 512, electrodes 112, metal fingers 514, etc.

Figure 8:
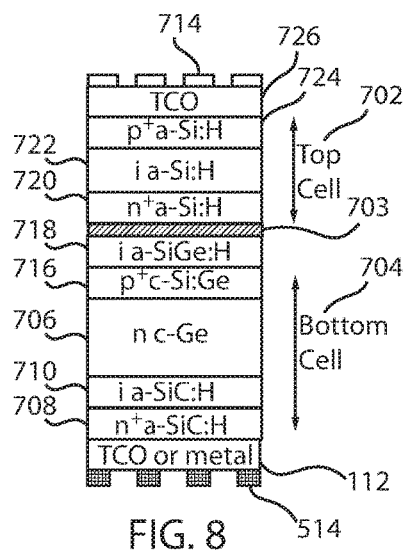
FIG. 8 is a cross-sectional view of a multi-junction device having a Ge bottom cell with an n-type substrate in accordance with the present principles and a top cell including a p-i-n stack in accordance with one embodiment.

Referring to FIG. 8, another multi-junction embodiment includes a bottom cell 704 formed in accordance with the present principles, a top cell 702 having one or more conventional cells and a tunnel layer 703 disposed therebetween. The bottom cell 704 employs an n-type c-Ge substrate 706, an n+ doped layer 708 including, e.g., a-$Si_{1-y1}C_{y1}$:H and an intrinsic layer 710 including, e.g., a-$Si_{1-y2}C_{y2}$:H. The values of y1 and y2 may be constant or vary across the SiC layer. There is no correlation between y1 and y2. The bottom cell 704 employs a p+ doped layer 716 including, e.g., c-$Si_{1-x1}Ge_{x1}$:H and an intrinsic layer 718 including, e.g., a-$Si_{1-x2}Ge_{x2}$:H. The top cell 702 may include a p-i-n a-Si:H cell or cells with a p+-doped a-Si:H layer 724, an a-Si:H intrinsic layer 722 and an n+-type doped a-Si:H layer 720. The values of x1 and x2 may be constant or vary across the SiGe layers. There is no correlation between x1 and x2. There is also no correlation between x1/x2 and y1/y2. Other structures or layers may include a metal grid 714, TCO layer 726, electrode 112, metal fingers 514, etc.

Figure 9:
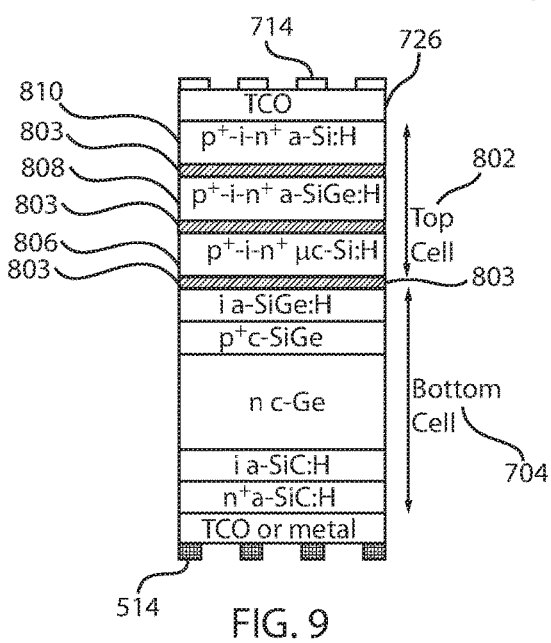
FIG. 9 is a cross-sectional view of a multi-junction device having a Ge bottom cell with an n-type substrate in accordance with the present principles and a top cell including multiple p-i-n stacks with different base materials in accordance with one embodiment.

Referring to FIG. 9, another multi-junction embodiment includes the bottom cell 704 formed in accordance with the present principles and top cells 806, 808, 810 including conventional p-i-n structures with tunneling layers 803 disposed therebetween. The bottom cell 704 is described with respect to FIG. 8. The top cells 806, 808 and 810 include p+-i-n+ layers with different base materials. For example, the pin stack for layer 806 includes microcrystalline Si:H (this means the n-type layer, the intrinsic layer and the p-type layer all include the same base material). The pin stack for layer 808 includes amorphous SiGe:H, and the pin stack for layer 810 includes amorphous Si:H. Other structures and materials are also contemplated. Other structures or layers may include a metal grid 714, TCO layer 726, etc.

Figure 10:
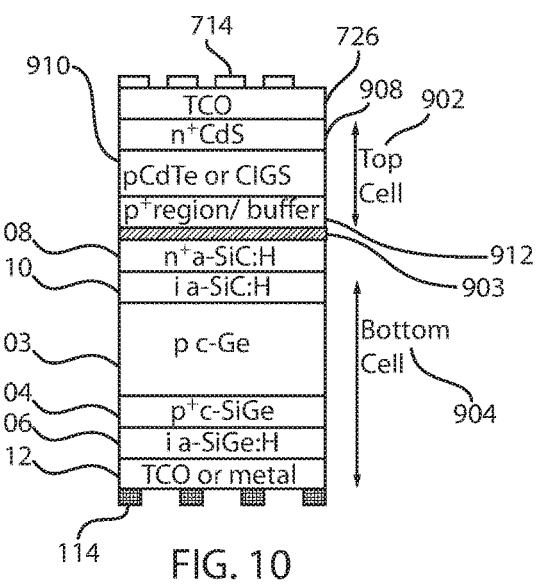
FIG. 10 is a cross-sectional view of a multi-junction device having a Ge bottom cell with a p-type substrate in accordance with the present principles and a top cell including CdS/CdTe, CdS/CIGS, CdS/CZTS or CdS/CZTSe in accordance with one embodiment.

Referring to FIG. 10, another multi-junction embodiment includes a bottom cell 904 formed in accordance with the present principles and a top cell 902 formed from conventional CdS/CdTe, CdS/CIGS (copper indium gallium selenide), CdS/CZTS (copper zinc tin sulfide), CdS/CZTSe (copper zinc tin selenide) or other cells with an optional tunneling layer 903 disposed therebetween. In this illustrative embodiment, the bottom cell 904 includes the structure described with respect to FIG. 3A. In this example, the top cell 902 includes a p-doped CdTe, CIGS, CZTS or CZTSe intrinsic layer 910, an n+-doped CdS layer 908 and a p+ doped region or buffer layer 912.

The device structures described in FIGS. 6 through 10 improve the open circuit voltage of the multi-junction cell (which is the sum of the open circuit voltages of the single-junction cells present in the multi-junction cell) by employing the disclosed germanium-containing bottom cell which has an improved open circuit voltage compared to conventional cells without compromising the fill factor of the bottom cell (and therefore the fill-factor of the multi-junction cell).

Figure 11:
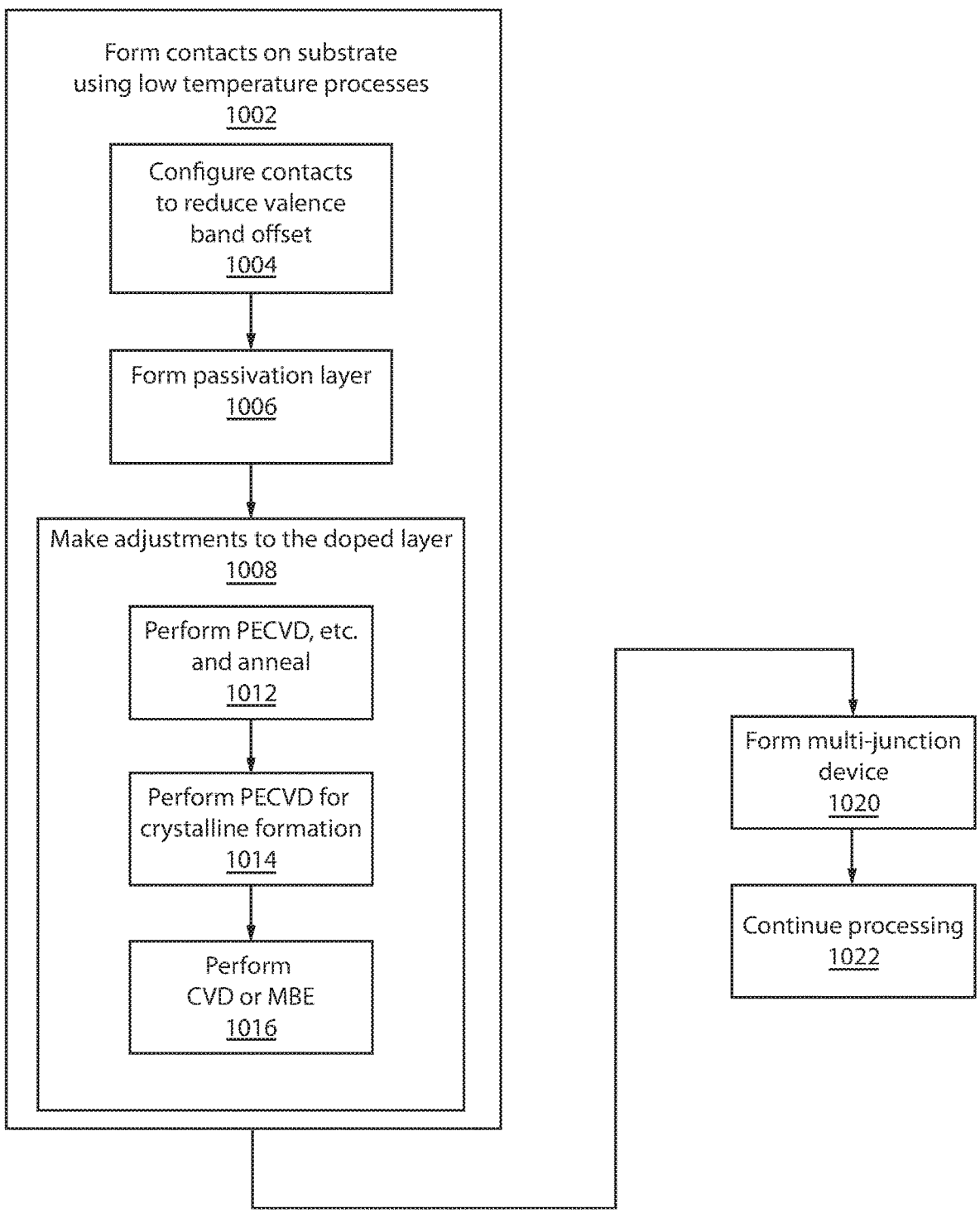
FIG. 11 is a block/flow diagram showing an illustrative method for fabricating photovoltaic devices in accordance with one illustrative embodiment.

Referring to FIG. 11, an illustrative method for fabricating photovoltaic devices in accordance with the present principles is illustratively shown. It should also be noted that, in some alternative implementations, the functions noted in the block may occur out of the order noted in FIG. 11. For example, two blocks shown in succession may, in fact, be executed substantially concurrently, or the blocks may sometimes be executed in the reverse order, depending upon the functionality involved.

In block 1002, an emitter contact is formed on a front side of a germanium-containing substrate, and a back contact is formed on a back side of the germanium-containing substrate. One of the contacts may be formed on the substrate first and then the other contact is formed on the substrate. The formation of the contacts preferably includes low temperature processes. In block 1004, at least one of the emitter contact and the back contact are configured by including a composition of elements adjusted, as disclosed herein, to improve open circuit voltage of the solar cell while at least maintaining fill factor. The doped layer includes, e.g., one of $Si_{1-y}C_y$ and $Si_{1-x}Ge_x$.

In block 1006, a passivation layer may be formed in contact with the doped layer and disposed between the substrate and the one of the emitter contact and the back contact. The passivation layer may be formed by using plasma enhanced chemical vapor deposition (PECVD) or hot-wire chemical vapor deposition (HWCVD) at conditions leading to amorphous film growth at a temperature of less than about 200° C. to about 400° C., lower temperatures being preferred.

In block 1008, adjustments may be made to the doped layer during its formation or after its formation by changing the composition ratios (e.g., x or y values). The formation of the contacts (emitter or back) is preferably performed using low temperature deposition processes. An emitter contact includes at least one doped layer of the opposite conductivity type as that of the substrate on a front side of the substrate and a back contact includes an intrinsic and/or doped layer(s) of the same conductivity type as that of the substrate, and/or conductive layer(s) such as metal on a back side of the substrate. The at least one doped layer in the emitter contact or the back contact includes an n-type material having an electron affinity smaller than that of the germanium-containing substrate, and/or a p-type material having a hole affinity larger than that of the germanium containing substrate.

In block 1012, a plasma enhanced chemical vapor deposition (PECVD), or hot-wire chemical vapor deposition (HWCVD) may be employed at conditions leading to single-crystalline growth at deposition temperatures at about 200° C. (e.g., less than 200° C. to about 400° C.). In block 1014, a plasma enhanced chemical vapor deposition (PECVD), hot-wire chemical vapor deposition (HWCVD), sputtering, or thermal/e-beam evaporation, at conditions leading to amorphous film growth at a temperature of about 200° C. (e.g., less than 200° C. to about 400° C.) and a solid-phase crystallization of the doped layer employing annealing. The annealing may be performed at a high temperature (e.g., up to about 650° C.) or a longer term low-temperature anneal. In block 1016, forming the doped layer may include depositing the doped layer with chemical vapor deposition (CVD) or molecular beam epitaxy (MBE). Examples of CVD include but are not limited to rapid thermal CVD, low-pressure CVD and ultra-high-vacuum CVD.

In block 1020, at least one other photovoltaic device is formed to provide a multi-junction photovoltaic device. The at least one other photovoltaic device may include a cell having one or more of a III-V material cell, a p-i-n stack, multiple p-i-n stacks, a CdS/CdTe cell, CdS/CIGS (copper indium gallium selenide) cell, a CdS/CZTS (copper zinc tin sulfide) cell, and a CdS/CZTSe (copper zinc tin selenide) cell. In block 1022, processing continues to complete the device or devices.

Referring to FIGS. 12A and 12B, a photovoltaic test device 1100 was fabricated in accordance with the structure and one of the methods in accordance with the present principles (FIG. 12B) and compared to a control sample 1050 (FIG. 12A). The photovoltaic device 1100 was fabricated using PECVD growth of a p$^+$ a-Si:H layer at ~200° C., followed by rapid thermal annealing at ~600° C. for solid-phase crystallization of p$^+$ a-Si:H to form p$^+$ poly-Si 1102. The thickness of the p$^+$ a-Si:H (and therefore the p$^+$ poly-Si layer 1102) is less than 15 nm. An optional passivation layer was not grown on the p$^+$ poly-Si layer 1102. An emitter structure typically used for Si heterojunction solar cells comprised of a p$^+$/i a-Si:H stack 1052 was deposited by PECVD on the control sample 1050 at ~200° C. The thickness of the p$^+$/i a-Si:H stack 1052 is less than 15 nm. A PECVD stack 1054 comprised of n$^+$/i a-Si:H was deposited on the back side of both devices at ~200° C., followed by the sputtering of a TCO 1058 and evaporation of the metal fingers 1056 and the back contact metal on both devices. The thickness of the n$^+$/i a-Si:H stack 1054 is less than 30 nm. The experimental output characteristics of the two devices under an illumination intensity of one sun is plotted in FIG. 13. The control device 1050 has a low short circuit current density of ~5 mA/cm$^2$ and a fill-factor of less than 20%, while the test device 1100 shows a significantly higher short circuit current density of ~50 mA/cm$^2$ and a fill-factor of over 40%. This is primarily because the valence band offset between a-Si:H 1052 and c-Ge 1060 (approximately 0.7-0.9 eV) is reduced by solid-phase crystallization of a-Si:H into poly-Si 1102 (approximately 0.3-0.5 eV) allowing for improved carrier transport at the emitter junction.

Having described preferred embodiments for heterojunction devices and methods for fabrication (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating a photovoltaic device, comprising:
   forming an emitter contact on a front side of a germanium-containing substrate and a back contact on a back side of the germanium-containing substrate wherein the step of forming includes:
   configuring at least one of the emitter contact and the back contact to include a doped layer in direct contact with the germanium-containing substrate, the doped layer is a single crystalline material including one of an n-type semiconductor material having an electron affinity smaller than that of the germanium-containing substrate, or a p-type semiconductor material having a hole affinity larger than that of the germanium-containing substrate, wherein the doped layer is selected from the group consisting of Si$_x$Ge$_{1-x}$, and Si$_x$C$_{1-x}$, wherein the value of x is adjusted to adjust the band gap of the doped layer, wherein said band gap is adjusted so that the conduction band offset between the germanium-containing substrate and the n-type semiconductor material of said Si$_x$C$_{1-x}$ is 0.5 eV or less, or the valence band offset between the germanium-containing substrate and the p-type semiconductor material layer of said Si$_x$Ge$_{1-x}$ is 0.5 eV or less, and the doped layer is formed by a deposition process at a deposition temperature of less than 400° C. that deposits the doped layer as said single crystalline material; and
   forming an intrinsic semiconductor layer comprising silicon in combination with at least one of germanium and carbon directly on the doped layer using a deposition process employing a deposition temperature ranging from 200° C. to 400° C.

2. The method as recited in claim 1, wherein the doped layer is formed by depositing the doped layer with one of chemical vapor deposition (CVD) or molecular beam epitaxy (MBE).

3. The method as recited in claim 1, further comprising forming at least one other photovoltaic device to provide a multi-junction photovoltaic device.

4. A method for fabricating a photovoltaic device, comprising:
   forming an emitter contact on a front side of a germanium-containing substrate, wherein the step of forming includes:
   configuring the emitter contact to include a doped layer in direct contact with the germanium-containing substrate, the doped layer is a single crystalline material including one of an n-type semiconductor material having an electron affinity smaller than that of the germanium-containing substrate, or a p-type semiconductor material having a hole affinity larger than that of the germanium-containing substrate, wherein the doped layer is selected from the group consisting of Si$_x$Ge$_{1-x}$, and Si$_x$C$_{1-x}$, wherein the value of x is adjusted to adjust the band gap of the doped layer, wherein said band gap is adjusted so that the conduction band offset between the germanium-containing substrate and the n-type semiconductor material of said Si$_x$C$_{1-x}$ is 0.5 eV or less, or the valance band offset between the germanium-containing substrate and the p-type semiconductor material layer of said $Si_xGe_{1-x}$ is 0.5 eV or less, and the doped layer is formed by a deposition process at a deposition temperature of less than 400° C. that deposits the doped layer as said single crystalline material; and forming an intrinsic semiconductor layer comprising silicon in combination with at least one of germanium and carbon directly on the doped layer using a deposition process employing a deposition temperature ranging from 200° C. to 400° C.

5. The method as recited in claim 4, wherein the doped layer is formed by depositing the doped layer with one of chemical vapor deposition (CVD) or molecular beam epitaxy (MBE).

6. The method as recited in claim 4, further comprising forming at least one other photovoltaic device to provide a multi-junction photovoltaic device.

7. A method for fabricating a photovoltaic device, comprising:

forming a back contact on a back side of the germanium substrate wherein the step of forming includes:

configuring the back contact to include a doped layer in direct contact with the germanium-containing substrate, the doped layer is a single crystalline material including one of an n-type semiconductor material having an electron affinity smaller than that of the germanium-containing substrate, or a p-type semiconductor material having a hole affinity larger than that of the germanium-containing substrate, wherein the doped layer is selected from the group consisting of $Si_xGe_{1-x}$, and $Si_xC_{1-x}$, wherein the value of x is adjusted to adjust the band gap of the doped layer, wherein said band gap is adjusted so that the conduction band offset between the germanium-containing substrate and the n-type semiconductor material of said $Si_xC_{1-x}$ is 0.5 eV or less, or the valance band offset between the germanium-containing substrate and the p-type semiconductor material layer of said $Si_xGe_{1-x}$ is 0.5 eV or less, and the doped layer is formed by a deposition process at a deposition temperature of less than 400° C. that deposits the doped layer as said single crystalline material; and forming an intrinsic semiconductor layer comprising silicon in combination with at least one of germanium and carbon directly on the doped layer using a deposition process employing a deposition temperature ranging from 200° C. to 400° C.

* * * * *